United States Patent
Vafai et al.

(10) Patent No.: US 12,293,957 B2
(45) Date of Patent: May 6, 2025

(54) OPTIMIZATION OF THE THERMAL PERFORMANCE OF THE 3D ICS UTILIZING THE INTEGRATED CHIP-SIZE DOUBLE-LAYER OR MULTI-LAYER MICROCHANNELS

(71) Applicant: Kambix Innovations, LLC, Albuquerque, NM (US)

(72) Inventors: Kambiz Vafai, Mission Viejo, CA (US); Sainan Lu, Jurupa Valley, CA (US)

(73) Assignee: Kambix Innovations II, LLC, Albuquerque, NM (US)

( * ) Notice: Subject to any disclaimer, the term of this patent is extended or adjusted under 35 U.S.C. 154(b) by 0 days.

(21) Appl. No.: 18/793,277

(22) Filed: Aug. 2, 2024

(65) Prior Publication Data
US 2025/0087556 A1    Mar. 13, 2025

Related U.S. Application Data

(63) Continuation of application No. 18/214,141, filed on Jun. 26, 2023, now Pat. No. 12,087,663.

(60) Provisional application No. 63/356,873, filed on Jun. 29, 2022.

(51) Int. Cl.
*H01L 23/467*    (2006.01)
*H01L 25/065*    (2023.01)

(52) U.S. Cl.
CPC ........ *H01L 23/467* (2013.01); *H01L 25/0657* (2013.01)

(58) Field of Classification Search
CPC .......................... H01L 23/467; H01L 25/0657
See application file for complete search history.

(56) References Cited

U.S. PATENT DOCUMENTS

| | | | |
|---|---|---|---|
| 6,675,875 B1 * | 1/2004 | Vafai | H05K 7/20381 174/15.1 |
| 7,156,159 B2 * | 1/2007 | Lovette | H01L 23/473 257/E23.098 |
| 2002/0079087 A1 * | 6/2002 | Vafai | H01L 23/473 257/E23.098 |
| 2005/0139992 A1 * | 6/2005 | Holalkere | H01L 23/473 438/117 |
| 2008/0277779 A1 * | 11/2008 | Gupta | H01L 23/473 257/E23.101 |
| 2014/0001604 A1 * | 1/2014 | Sadaka | B01L 3/502707 438/456 |
| 2017/0186728 A1 * | 6/2017 | Chainer | H01L 23/3738 |
| 2018/0158756 A1 * | 6/2018 | Smoot | H01L 21/4871 |

* cited by examiner

*Primary Examiner* — Peniel M Gumedzoe
(74) *Attorney, Agent, or Firm* — Ortiz & Lopez, PLLC; Kermit D. Lopez; Luis M. Ortiz

(57) ABSTRACT

A three-dimensional integrated circuit apparatus includes a three-dimensional integrated circuit including a group of integrated double-layer microchannels (DLMC) and multi-layer microchannels (MLMC) with optimized thermal performance for the three-dimensional integrated circuit. A heat source can be uniformly distributed in each layer and can be conducted through the layers down to the substrate and up to a spreader and a heat sink, and eventually to ambient air through forced convective heat transfer above the heat sink and natural convective heat transfer under the substrate.

15 Claims, 6 Drawing Sheets

OPTIMIZATION OF THE THERMAL PERFORMANCE OF THE 3D ICS UTILIZING THE INTEGRATED CHIP-SIZE DOUBLE-LAYER OR MULTI-LAYER MICROCHANNELS

CROSS REFERENCE TO PROVISIONAL APPLICATION

This patent application is a continuation of U.S. patent application Ser. No. 18/214,141 entitled "Optimization of the Thermal Performance of the 3D ICs Utilizing the Integrated Chip-size Double-layer or Multi-layer Microchannels," which was filed on Jun. 26, 2023 and is incorporated herein by reference in its entirety.

U.S. patent application Ser. No. 18/214,141 claims priority under 35 U.S.C. § 119 to U.S. Provisional Patent Application Ser. No. 63/356,873 entitled "Optimization of the Thermal Performance of the 3D ICs Utilizing the Integrated Chip-size Double-layer or Multi-layer Microchannels," which was filed on Jun. 29, 2022, and is incorporated herein by reference in its entirety.

TECHNICAL FIELD

Embodiments are related to integrated circuits. Embodiments are also related to three-dimensional (3D) integrated circuits. Embodiments further relate to chip-size integrated double-layer microchannels (DLMC) and multi-layer microchannels (MLMC) used in three-dimensional integrated circuits.

BACKGROUND

A three-dimensional integrated circuit (3D IC) is a metal-oxide semiconductor-integrated circuit manufactured by stacking silicon wafers or dies and interconnecting them vertically using through-silicon vias (TSVs), such that they behave as a single integrated device to achieve higher performance, lower power consumption, higher functional density, lower transistor packaging density, and a smaller form factor than conventional two-dimensional integrated circuits.

Due to drastically increased integration density of 3D ICs, the task of removing a large amount of dispersed heat from a constrained space is beyond the capability of conventional cooling techniques. The accumulated heat within the device and the hotspot temperature are undesirable for the electrical performance since many electrical parameters are adversely affected by a substantial temperature rise [1-3]. As such effective heat removal from the 3D structure is extremely crucial.

Tavakkoli et al. [4,5] performed a comprehensive thermal analysis of 3D high performance chips using numerical simulations. The effect of parametric changes in the geometrical configuration on the temperature distribution and hotspot temperatures were extensively highlighted, such as size, number and spacing, TSV arrangements (nominal TSVs, uniform TSVs and core-concentrated TSVs). The investigation also sufficiently outlined the impact of the thermophysical properties of the chip and cooling fluid on the flow and heat transfer. Their results presented the key features to be used for establishing optimized design and setup of 3D ICs.

Wang et al. [6] performed an analysis to study the effects of geometric and thermal properties of multi-layer nominal 3D IC chips on the temperature hotspots with different distributions of processors (overlapped cores and staggered cores). They found that the larger the number of the chip layers, the higher the hotspot temperature is; but having a large Reynolds number can help decrease the hotspot temperature. Tavakoli, Salimpour and Vafai [7] investigated the optimization of the heat spreader by inserting the boron arsenide structures, including radial, one level of paring and two-level paring structures. Their results have shown that the two-level paring boron arsenide structures in the heat spreader achieved the superior performance by reducing the hotspot temperature up to 14%.

Tavakoli and Vafai [8] also established a numerical investigation of the optimal distribution of a limited amount of high thermal conductivity material to enhance the heat removal from 3D ICs. Single-layer and double-layer ring shape inserts were studied and optimized for the thermal performance. Their results show that the maximum temperature of the 3D IC is reduced up to 10% for the optimal condition and the size of the heat sink and heat spreader can be 200% smaller compared to the conventional ones.

Lu and Vafai [9] had established that rectangular-shaped heat pipes (RSHP) and disk-shaped heat pipes (DSHP) heat sinks substantially improved the overall thermal performance and reduced the hotspot temperatures by 7 K and 11 K on average, respectively. Furthermore, utilizing these innovative RSHP or DSHP as the heat spreader underneath the RSHP or DSHP heat sink further optimizes the thermal performance by reducing the junction temperatures by 14 K and 16 K on average, respectively. While RSHP and DSHP possess an excellent ability to removing the generated heat, microchannels have also been implemented in the electronic cooling systems to improve the thermal performance [10].

Microchannel heat sinks which were first proposed by Tuckerman and Pease [11], have been investigated and tested as high performance and compact cooling schemes. Both the industry and research communities have investigated the use of high performance microchannels on 3D IC structures. The works from IBM (Armonk, NY) [12-13] illustrate the structure and fabrication process of the integrated single-layer microchannel (SLMC) for 3D ICs. The SLMCs are distributed among device layers. Cooling fluid is delivered to the 3D ICs by employing fluidic through silicon vias (TSVs) and fluidic pipes [13].

With this configuration, Mizunuma et al. [14] developed a fast and accurate thermal-wake model for integrated SLMC 3D IC structure which shows that the integrated SLMC 3D IC reduces the junction temperature significantly. Lu et al. [15] investigated a Multiphysics-based co-simulation technique for the performance of 3D IC structure with integrated SLMC cooling. The integrated SLMC effectively reduced the hotspot temperature and achieved a more uniform temperature distribution. Feng et al. [16] focused on the fast and accurate GPU-based solver development and they showed that integrated SLMC cooling is effective in improving the thermal performance of 3D ICs.

One drawback of SLMC heat sink is the relatively higher streamwise temperature rise. This undesirable temperature gradient produces thermal stresses in IC packages and undermines both the thermal performance and the electrical performance [1-3]. Double-layer or multi-layer microchannels (DLMC or MLMC) can contribute to resolve these problems. DLMC and MLMC were first introduce by Vafai and Zhu [17-19]. DLMC and MLMC are not only excellent in reducing the undesired temperature variation in the streamwise direction thus enhancing the overall cooling capacity compared to the SLMC, but also have lower pressure drop and require less pumping power [17-20].

It should be noted that the counter-flow layout was implemented in Vafai and Zhu's works [17-19]. Following Vafai and Zhu [17-19], Xie et al. [21-24] explored straight and wavy rectangular DLMC with parallel-flow and counter-flow layouts. Their results show that the counter-flow DLMC has superior thermal performance, more uniform temperature rise and lower overall thermal resistance for various scenarios. The other limitation of the integrated SLMC on 3D ICs studied in [12-16] is the significant increased risk of water permanently damaging the 3D IC structure due to the fact that the integrated SLMCs among the device layers requires the fluidic TSVs and pipes to deliver the water into the structure.

To resolve the above problems, this work introduces the integrated chip-size DLMC and MLMC on top and bottom of the 3D IC structures to avoid the fluidic TSVs and pipes within the dies and improve the overall cooling performance. The hotspot temperature reductions and the substantial weight and size reduction of the heat sink equipment in diverse configurations of integrated DLMC and MLMC are thoroughly illustrated. In addition, optimization of the integrated DLMC and MLMC is discussed, including adding a heat sink on top of the structure, the change of the dimensions of the DLMC and investigation of nanofluids within the DLMC.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved integrated circuit.

It is another aspect of the disclosed embodiments to provide for an improved 3D integrated circuit.

The aforementioned aspects and other objectives and advantages can now be achieved as described herein.

In an embodiment, a three-dimensional integrated circuit apparatus, can include a three-dimensional integrated circuit comprising a substrate and a plurality of integrated double-layer microchannels (DLMC) and multi-layer microchannels (MLMC) with optimized thermal performance for the three-dimensional integrated circuit, wherein the plurality of integrated double-layer microchannels (DLMC) and multi-layer microchannels (MLMC) are located above the substrate.

In an embodiment, the three-dimensional integrated circuit can comprise a metal-oxide semiconductor-integrated circuit.

In an embodiment, a heat source can be uniformly distributed in each layer of a plurality of layers of the three-dimensional integrated circuit and can be conducted through the plurality of layers down to the substrate and up to a spreader and a heat sink, and eventually to ambient air through forced convective heat transfer above the heat sink and natural convective heat transfer under the substrate.

In an embodiment, a three-dimensional integrated circuit apparatus, can include a three-dimensional integrated circuit including a group of integrated double-layer microchannels (DLMC) and multi-layer microchannels (MLMC) with optimized thermal performance for the three-dimensional integrated circuit.

In an embodiment, chip-size integrated double-layer microchannels (DLMC) and multi-layer microchannels (MLMC) can be used to optimize the thermal performance of three-dimensional integrated circuits (3D ICs). The chip-size integrated DLMC without a heat spreader and a heat sink can reduce the hotspot temperature for a nominal 3D IC structure.

In an embodiment, the size is significantly smaller than copper heat sinks and the weight of the chip-size integrated DLMC can be reduced by 99.9%.

Furthermore, in an embodiment, two chip-size integrated DLMCs can lower the hotspot temperature compared with utilizing just one integrated DLMC on top of the chip structure. Results show that the disclosed multi-layer microchannels (MLMC) have a great effect on reducing the hotspot temperature.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
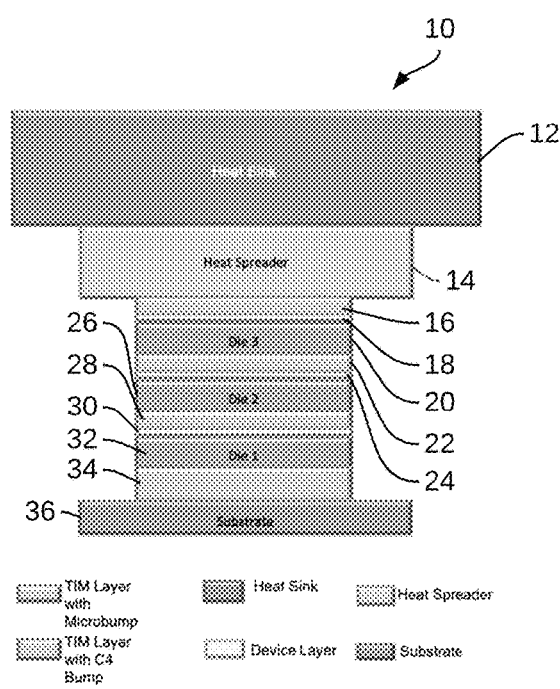
FIG. 1 illustrates a schematic diagram of the structure of a three-dimensional integrated circuit, in accordance with an embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part. In addition, identical reference numerals utilized herein with respect to the drawings can refer to identical or similar parts or components.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Embodiments relate to a chip-size integrated double-layer microchannels (DLMC) and multi-layer microchannels (MLMC) that can optimize the thermal performance of three-dimensional integrated circuits (3D ICs). In an example embodiment, the chip-size integrated DLMC without a heat spreader and a heat sink reduced the hotspot temperature by almost 15 K for a nominal 3D IC structure. Meanwhile, the size is significantly smaller than the copper heat sinks and the weight of the chip-size integrated DLMC was reduced by 99.9%. Furthermore, two chip-size integrated DLMCs can lower the hotspot temperature by another 6.77 K compared with utilizing just one integrated DLMC on top of the chip structure. The results also show that the multi-layer microchannels (MLMC) have a great effect on reducing the hotspot temperature. We have established that the optimal layout is 4 layers. The hotspot temperature can be reduced by 21 K and 102 times lighter in weight compared to nominal 3D IC structure. The proposed structure and results presented herein can pave the way for major innovations in resolving the thermal issues for the 3D ICs.

FIG. 1 illustrates a schematic diagram of the structure of a three-dimensional integrated circuit 10, in accordance with an embodiment. The three-dimensional integrated circuit 10 can include a substrate 36 upon which a variety of layers and components may be configured. A layer 34 comprising a TIM layer with C4 bump can be configured above the substrate 36. A first die layer 32 can be configured on and above the layer 34. A device layer 30 can be formed above the first die layer 32. A layer 28 comprising a TIM layer with microbump(s) can be configured above the layer 30.

A second die layer 26 can be formed above the layer 28. A device layer 24 can be formed above the second die layer 26. A layer 22 comprising a TIM layer with microbump(s) can be formed above the device layer 24. A third die layer 20 can be configured above the layer 22. A device layer 18 can be formed above layer 20. A layer 16 comprising a TIM layer with microbump(s) can be formed above the layer 18. A heat spreader 14 can be formed above the layer 16. A heat sink 12 can be formed above the heat spreader 14.

Note that the term "TIM layer with microbump(s)" as utilized herein in the context of an integrated circuit (IC) formed on a substrate, can relate to a Thermal Interface Material (TIM) layer that can be utilized to improve heat dissipation and thermal conductivity between the IC and its surrounding components or heatsink.

When the IC operates, it generates heat, which needs to be efficiently dissipated to prevent overheating and maintain optimal performance. The TIM layer can act as a thermal bridge, facilitating the transfer of heat from the IC to the surrounding components or a heatsink.

Microbumps, on the other hand, are small solder or metal bumps located on the surface of the IC or substrate. They can be used to establish electrical connections between different layers or components within the IC, such as connecting the IC to a package substrate.

By combining a TIM layer with microbumps, the thermal conductivity and electrical connectivity can be simultaneously enhanced. The microbumps provide electrical connections while also creating additional contact points for heat transfer between the IC and the heatsink or other cooling mechanisms. The TIM layer can fill the gaps between the IC and the heatsink, thereby reducing thermal resistance and improving overall heat dissipation. This combination of a TIM layer with microbumps can help to address both thermal management and electrical connectivity requirements in integrated circuits, ensuring efficient heat dissipation while maintaining reliable electrical performance.

Figure 2:
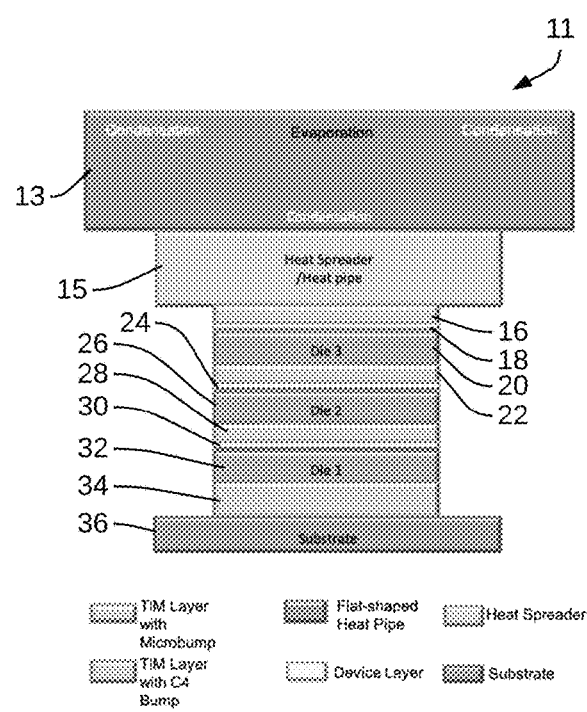
FIG. 2 illustrates a schematic diagram of a three-dimensional integrated circuit including a heat pipe comprising a heat sink or a heat spreader, in accordance with an embodiment.

FIG. 2 illustrates a schematic diagram of a three-dimensional integrated circuit 11 including a heat pipe 15 as a heat sink or a heat spreader, in accordance with an embodiment.

The three-dimensional integrated circuit 11 shown in FIG. 1 is similar to the three-dimensional integrated circuit 10 depicted in FIG. 1, but with some differences including the heat pipe 15 functioning a heat sink or a heat spreader, and a layer 13 comprising a flat-shaped heat pipe.

Schematics of nominal 3D IC structures are shown in FIG. 1 and FIG. 2. The nominal 3D IC structure includes a substrate, thermal interface material (TIM) with C4 bumps, three layers of dies, device layers and TIM with microbumps, a heat spreader and a heat sink on top. Four core processors, fabricated on each device layer, are the main heat sources.

Figure 3A:
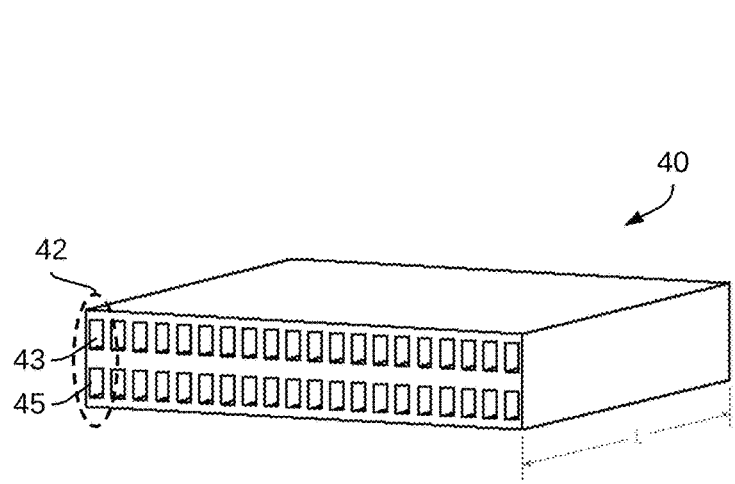
FIG. 3A illustrates a schematic diagram of a chip-size integrated double-layer microchannels (DLMC) structure, in accordance with an embodiment.
Figure 3B:
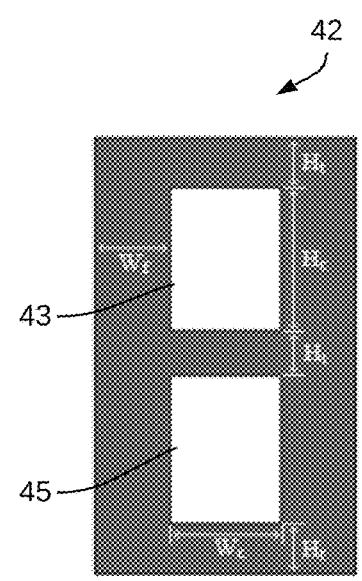
FIG. 3B illustrates a magnified view of a set of channels of the chip-size integrated DLMC structure shown in FIG. 3A, in accordance with an embodiment.

Table 1 displays the nominal values for different components of the 3D IC structure for nominal cases. The chip-size DLMC structure fabricated with copper [10, 15, 25-31], as illustrated in FIG. 3A and FIG. 3B, is 10×10 mm² and the dimensions for channel width, channel height, fin width, and base and cover thickness are presented in Table 2.

TABLE 2

Nominal Values within the DLMC strcuture

| Structure | Channel Length L (mm) | Channel Width $W_c$ (μm) | Channel Height $H_c$ (μm) | Channel fin width $W_f$ (μm) | Channel base/cover thickness $H_t$ (μm) | Number of Channels N |
|---|---|---|---|---|---|---|
|  | 10 | 290 | 400 | 200 | 50 | 20 × 2 |
| References |  |  | [13, 15, 16, 21, 24-28] |  |  |  |

The heat source is uniformly distributed [9] in each layer (e.g., 30 W each layer and 7.5 W each processor). The heat can be conducted through the layers down to the substrate and up to the spreader and the heat sink, and eventually to the ambient air through forced convective heat transfer above the heat sink and natural convective heat transfer under the substrate. Conductive heat transfer through the solid, and isotropic layers of the 3D IC can be governed by $$\frac{\partial^2 \Theta_s^+}{\partial x^{+2}} + \frac{\partial^2 \Theta_s^+}{\partial y^{+2}} + \frac{\partial^2 \Theta_s^+}{\partial z^{+2}} + q_g^+ = 0 \quad (1)$$

Where $q_g^+$ denotes the dimensionless volumetric heat generation in the central processing units and the nondimensionalized temperature and spatial coordinates are set up as:

$$x^+ = \frac{x}{h}, \quad y^+ = \frac{y}{h}, \quad z^+ = \frac{z}{h}, \quad \Theta^+ = \frac{T - T_e}{qh/k_f}$$

The convective boundary conditions are $$\frac{\partial \Theta_s^+}{\partial n^*} = -Bi \cdot \Theta_s^+ \quad (2)$$

When the IC operates, it generates heat, which needs to be efficiently dissipated to prevent overheating and maintain optimal performance. The TIM layer can act as a thermal bridge, facilitating the transfer of heat from the IC to the surrounding components or a heatsink. Where n* is the normal coordinate and Bi is the dimensionless Biot number. Nominally, the heat flow occurs mainly normal to the device layers. The heat transfer and fluid flow for the DLMC needs to be accounted for. It is governed by the Navier-Stokes equation. The water as the coolant within the microchannel is pumped into the channel at 1 m/s [13]. The dimensionless Navier-Stokes equations in Cartesian coordinates are:

Mass Conservation:

$$\frac{\partial u^+}{\partial x^+} + \frac{\partial v^+}{\partial y^+} + \frac{\partial w^+}{\partial z^+} = 0 \quad (3)$$

x-Momentum Equation:

$$Re_h \left( u^+ \frac{\partial u^+}{\partial x^+} + v^+ \frac{\partial u^+}{\partial y^+} + w^+ \frac{\partial u^+}{\partial z^+} \right) = -\frac{\partial p^+}{\partial x^+} + \left( \frac{\partial^2 u^+}{\partial x^{+2}} + \frac{\partial^2 u^+}{\partial y^{+2}} + \frac{\partial^2 u^+}{\partial z^{+2}} \right) \quad (4)$$

y-Momentum Equation:

$$Re_h \left( u^+ \frac{\partial v^+}{\partial x^+} + v^+ \frac{\partial v^+}{\partial y^+} + w^+ \frac{\partial v^+}{\partial z^+} \right) = -\frac{\partial p^+}{\partial y^+} + \left( \frac{\partial^2 v^+}{\partial x^{+2}} + \frac{\partial^2 v^+}{\partial y^{+2}} + \frac{\partial^2 v^+}{\partial z^{+2}} \right) \quad (5)$$

z-Momentum Equation:

$$Re_h \left( u^+ \frac{\partial w^+}{\partial x^+} + v^+ \frac{\partial w^+}{\partial y^+} + w^+ \frac{\partial w^+}{\partial z^+} \right) = -\frac{\partial p^+}{\partial z^+} + \left( \frac{\partial^2 w^+}{\partial x^{+2}} + \frac{\partial^2 w^+}{\partial y^{+2}} + \frac{\partial^2 w^+}{\partial z^{+2}} \right) \quad (6)$$

Energy Conservation for the Fluid Domain:

$$Pe_h \left( u^+ \frac{\partial \Theta_f^+}{\partial x^+} + v^+ \frac{\partial \Theta_f^+}{\partial y^+} + w^+ \frac{\partial \Theta_f^+}{\partial z^+} \right) = \frac{\partial^2 \Theta_f^+}{\partial x^{+2}} + \frac{\partial^2 \Theta_f^+}{\partial y^{+2}} + \frac{\partial^2 \Theta_f^+}{\partial z^{+2}} \quad (7)$$

The nondimensionalized terms in the above equations are:

$$u^+ = \frac{u}{u_m}, \quad v^+ = \frac{v}{v_m}, \quad w^+ = \frac{w}{w_m}, \quad p^+ = \frac{ph}{\mu_f u_m},$$

$$Re_h = \frac{\rho_f u_m h}{\mu_f}, \quad Pe_h = \frac{\rho_f c_{p,f} u_m h}{k_f}$$

This work also investigates $Al_2O_3$ nanofluids within the DLMC to further optimize the thermal performance with higher thermal conductivity. The thermal conductivity, dynamic viscosity, density and specific heat of $Al_2O_3$ nanofluids are calculated as follows [32-35]:

$$\hat{k}_{nf} = \left[ \frac{k_p + (n-1)k_{bf} - (n-1)\varphi(k_{bf} - k_P)}{k_p + (n-1)k_{bf} + \varphi(k_{bf} - k_P)} \right] k_{bf} \quad (8)$$

$$\mu_{nf} = (1+2.5\varphi)\mu_{bf} \quad (9)$$

$$\rho_{nf} = (1-\varphi)\rho_{bf} + \varphi\rho_P \quad (10)$$

$$c_{p,nf} = (1-\varphi)c_{p,bf} + \varphi c_{p,P} \quad (11)$$

Where $k_{nf}$, $k_{bf}$ and $k_p$ are the thermal conductivities of $Al_2O_3$ the nanofluid, base fluid and solid particles, respectively. $\varphi$ is the volumetric concentration of nanoparticles and n is solid particle shape factor (n=3 with the assumption of spherical particles). $\mu_{nf}$ and $\mu_{bf}$ are the viscosities of the nanofluid and base fluid, respectively; $\rho_{nf}$, $\rho_{bf}$ and $\rho_P$ are the densities of nanofluid, base fluid and solid particles, respectively; $c_{p,nf}$, $c_{p,bf}$ and $c_{p,P}$ are the specific heat of the nanofluid, base fluid and solid particles, respectively. The calculated results for the above-mentioned properties are listed in Table 3.

TABLE 3

$Al_2O_3$ nanofluid properties

| | $\varphi = 0\%$ | $\varphi = 2\%$ | $\varphi = 5\%$ |
|---|---|---|---|
| $k_{nf}$ (w/m · K) | 0.603 | 0.638 | 0.693 |
| $\rho_{nf}$ (kg/m³) | 995.7 | 1047.7 | 1125.9 |
| $\mu_{nf}$ (kg/m · s) | $7.977 \times 10^{-4}$ | $8.376 \times 10^{-4}$ | $8.974 \times 10^{-4}$ |
| $C_{p,nf}$ (kJ/kg · K) | 4.183 | 4.115 | 4.012 |

TABLE 1

Nominal values for various parameters within the 3D IC structure [9]

| Layer | Parameter | Nominal Value | Unit |
|---|---|---|---|
| Heat sink | Material | Cu | |
| | Length & Width | 50 | mm |
| | Thickness | 4/29.4 | mm |
| Rectangular-shaped heat pipe | Material | Cu | |
| | Length & Width | 50 | mm |
| | Thickness | 29.4 | mm |
| Disk-shaped heat pipe | Material | Cu | |
| | Radius | 28 | mm |
| | Thickness | 29.4 | mm |
| Heat spreader | Material | Cu | |
| | Length & Width | 30 | mm |
| | Thickness | 3 | mm |
| Chip | Length & Width | 10 | mm |
| | Number of layers | 3 | mm |
| TIM layer with microbump | TIM material | Thermal grease | |
| | Thermal conductivity | 5 | W/m · K |
| | Thickness | 15 | μm |
| TIM layer with C4 bump | TIM material | Thermal grease | |
| | Thermal conductivity | 5 | W/m · K |
| | Thickness | 100 | μm |
| Die | Material | Si | |
| | Thickness | 100 | μm |
| Device layer | Material | Si | |
| | Thickness | 2 | μm |
| Core processor | Material | Si | |
| | Total power within the 3D IC | 90 | W |
| | Cores per layer | 4 | |
| | Length & Width | 2 | mm |
| | Thickness | 2 | μm |
| Substrate | Material | Si | |
| | Length & Width | 30 | mm |
| | Thickness | 1 | mm |

FIG. 3A illustrates a schematic diagram of a chip-size integrated DLMC structure 40, in accordance with an embodiment. The chip-size integrated DLMC structure 40 can be configured with a set of channels, examples of which are channels 42 including channels 43 and 45. FIG. 3B illustrates a magnified view of the set of channels 42 of the chip-size integrated DLMC structure 40 shown in FIG. 3A, in accordance with an embodiment.

Figure 4:
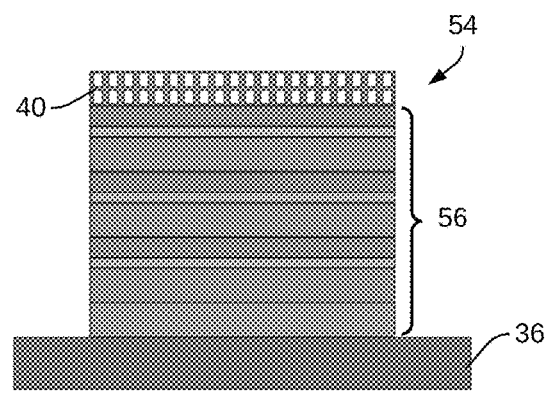
FIG. 4 illustrates a schematic diagram of a chip-size integrated DLMC on top of a 3D IC structure, in accordance with an embodiment.

FIG. 4 illustrates a schematic diagram of a 3D IC 54 with the chip-size integrated DLMC 40 on top of a 3D IC structure, in accordance with an embodiment. Note that the 3D IC structure may include a plurality of layers 56 formed on the substrate 36. Examples of such a 3D IC structure include the three-dimensional integrated circuit 10 and three-dimensional integrated circuit 11 shown respectively in FIG. 1 and FIG. 2. In the interest of brevity not every layer and component is described with respect to FIG. 4 through FIG. 9.

Figure 5:
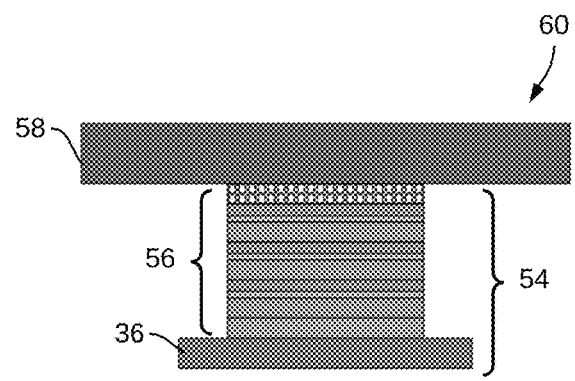
FIG. 5 illustrates a schematic diagram of a chip-size integrated DLMC on top of a 3D IC structure with a heat sink thereabove, in accordance with an embodiment.

FIG. 5 illustrates a schematic diagram of a 3D IC 60 including a chip-size integrated DLMC 60 on top of a 3D IC structure with a heat sink 58 thereabove, in accordance with an embodiment.

Figure 6:
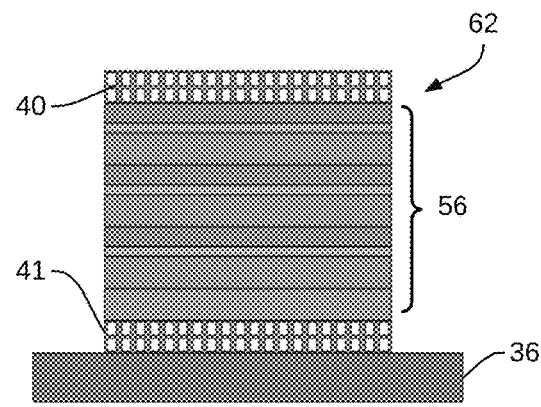
FIG. 6 illustrates a schematic diagram of a two chip-size integrated DLMC on top and at the bottom of a 3D IC structure, in accordance with an embodiment.

FIG. 6 illustrates a schematic diagram of a 3D IC 62 with a two chip-size integrated DLMC 40 and 41 respectively on top and at the bottom of a 3D IC structure, in accordance with an embodiment.

Figure 7:
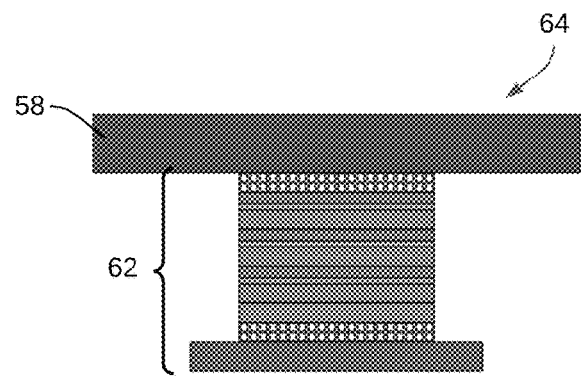
FIG. 7 illustrates a schematic diagram of a two chip-size integrated DLMC on top and at the bottom of a 3D IC structure with a heat sink thereabove, in accordance with an embodiment.

FIG. 7 illustrates a schematic diagram of a 3D IC 64 having a two chip-size integrated DLMC on top and at the bottom of a 3D IC structure with a heat sink 48 thereabove, in accordance with an embodiment.

Figure 8:
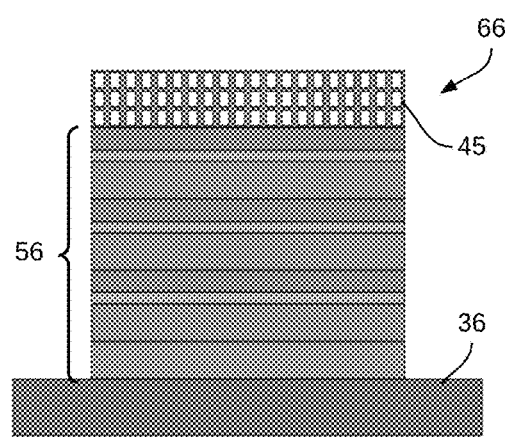
FIG. 8 illustrates a schematic diagram of a chip-size integrated three-layer microchannel on top of a 3D IC structure, in accordance with an embodiment.

FIG. 8 illustrates a schematic diagram of a 3D IC 66 including a chip-size integrated three-layer microchannel structure 45 on top of a 3D IC structure, in accordance with an embodiment.

Figure 9:
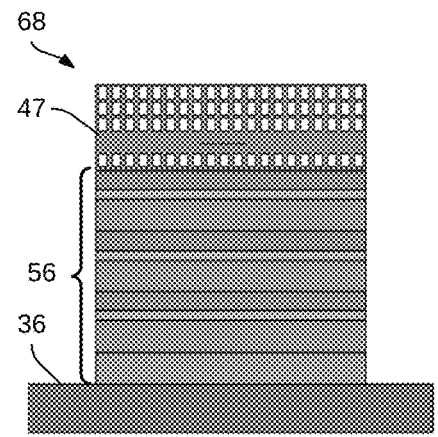
FIG. 9 illustrates a schematic diagram of a chip-size integrated MLMC on top of a 3D IC structure, in accordance with an embodiment.

FIG. 9 illustrates a schematic diagram of a 3D IC 68 with a chip-size integrated MLMC 47 on top of a 3D IC structure, in accordance with an embodiment.

The simulation and modeling of the thermal performance can be carried out through COMSOL Multiphysics. A grid independence study was performed for all investigated structures (e.g., FIG. 4-FIG. 9) and the junction temperature for each structure was evaluated using computational meshes for different cell distributions. The grid independence study for various cases applying physics-based coarse, fine, finer, normal and extra fine mesh distributions is shown in FIG. 10.

Figure 10:
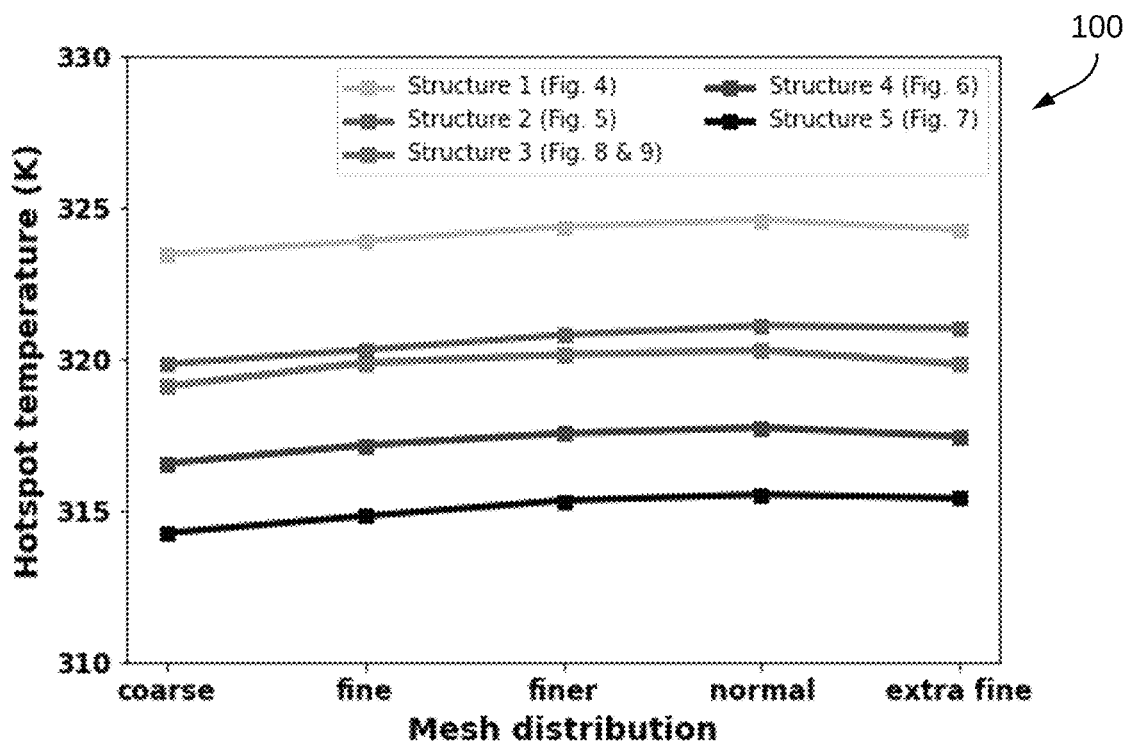
FIG. 10 illustrates a graph depicting data indicative of a grid independence study for the investigated structures discussed herein, in accordance with an embodiment.

FIG. 10 illustrates a graph 100 depicting data indicative of a grid independence study for the investigated structures discussed herein, in accordance with an embodiment. The overall temperature varies within 1 K. In order to reduce the computational time and gain accurate simulation results, the normal mesh distribution is sufficient to obtain accurate results and is employed in this work.

Note that the aforementioned COMSOL Multiphysics is a software package designed for simulation and modeling of physical phenomena across multiple disciplines. It provides engineers, researchers, and scientists with a comprehensive environment for analyzing and solving complex multiphysics problems.

COMSOL Multiphysics employs the finite element method (FEM) as the underlying numerical technique for solving partial differential equations (PDEs). It allows users to define their physical models and simulate the behavior of various systems by specifying the governing equations, boundary conditions, and material properties.

Figure 11:
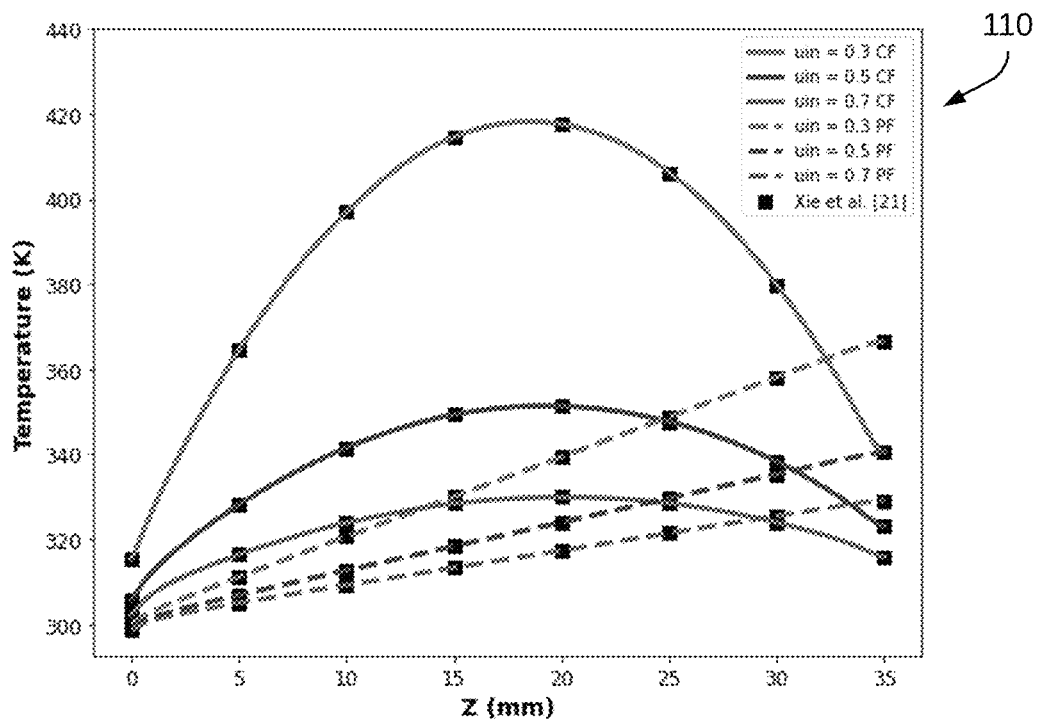
FIG. 11 illustrates a graph depicting the temperature distribution of the bottom surface of a DLMC with both counter-flow and parallel-flow layout, in accordance with an embodiment.
Figure 12:
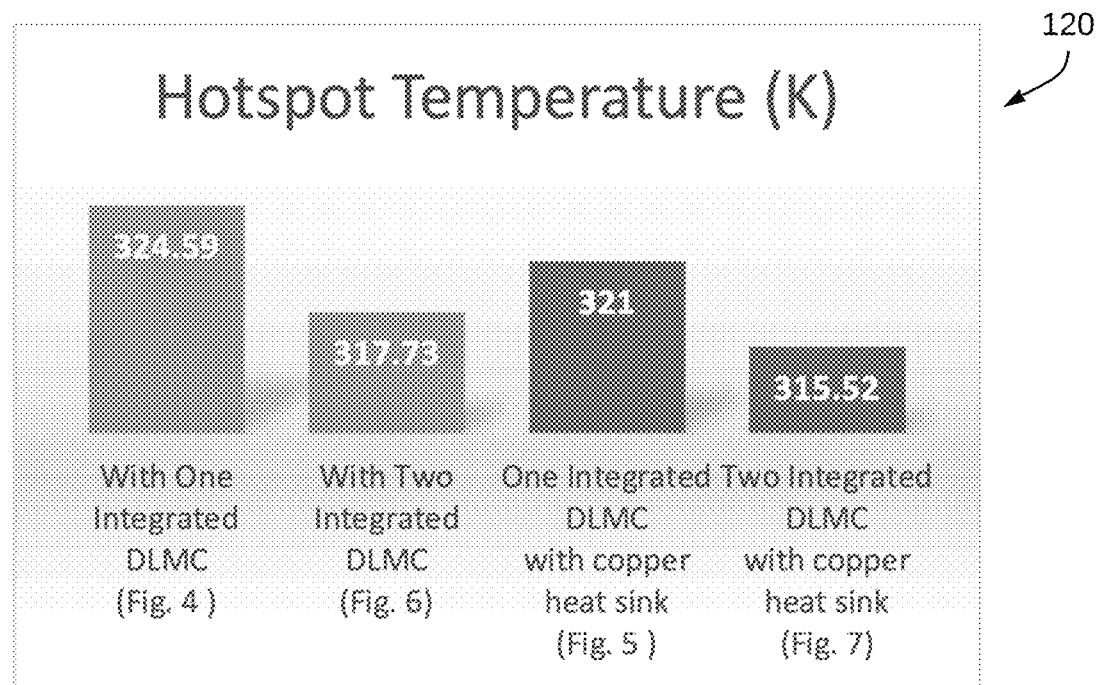
FIG. 12 illustrates a graph depicting data indicative of the effects of nanofluids within the integrated DLMC on the hotspot temperature, in accordance with an embodiment.

In addition, the main feature of the 3D IC structure model discussed herein can be validated earlier [9] both experimentally and numerically. The DLMC model was compared with the work of Xie et al. [21] in FIG. 11. FIG. 11 illustrates an excellent agreement for the temperature distribution for a DLMC for both parallel-flow and counterflow structure between the present work and reference [21]. FIG. 11 illustrates a graph 110 depicting the temperature distribution of the bottom surface of a DLMC with both counter-flow and parallel-flow layout, in accordance with an embodiment;

FIG. 12 illustrates a graph 120 depicting data indicative of the effects of nanofluids within the integrated DLMC on the hotspot temperature, in accordance with an embodiment.

Table 4 displays the thermal performance and weight comparison among nominal copper heat sink (FIG. 1), RSHP and DSHP (FIG. 2) and integrated chip-size DLMC (FIG. 4). It should be noted that the height for the nominal copper heat sink in this scenario is 29.4 mm in order to be consistent with the height of RSHP and DSHP. Compared with the nominal 3D IC structure with copper heat sink and heat spreader (FIG. 1), RSHP as the heat sink reduced the hotspot temperature by 6K and DSHP reduced the hotspot temperature by 16K while reducing the weight by 7.35 times. As it can be seen from Table 4, the chip-size integrated DLMC without a heat spreader and a heat sink, as illustrated in FIG. 4, reduced the hotspot temperature by almost 15 K. Meanwhile, the weight of the chip-size integrated DLMC is 1288 times lighter and the size is significantly smaller than the copper heat sink.

TABLE 4

Comparison of the Thermal Performance among different heat sinks

|  | Copper heat sink/ Reference (FIG. 1) | RSHP as the heat sink (FIG. 2) | DSHP as the heat sink (FIG. 2) | Integrated DLMC without a heat spreader and heat sink (FIG. 4) |
|---|---|---|---|---|
| Hotspot Temperature (K) | 339.2 | 333.7 | 323.3 | 324.5 |
| Reduction on Hotspot Temperature (K) | Reference | 5.5 | 15.9 | 14.7 |
| Weight Reduction | Reference | 7.35 times lighter | 7.35 times lighter | 1288 times lighter |

As shown in Table 5, the heat sink with a nominal height of 4 mm on top of the chip-size integrated DLMC (FIG. 5) can further optimize the thermal performance of the 3D IC structure. Next, we have employed the effect of combining a heat sink (copper heat sink, RSHP and DSHP as illustrated in FIGS. 1 and 2) and a chip-size integrated DLMC on the hotspot temperature. Integrated DLMC with a copper heat sink, RSHP and DSHP reduced the hotpot temperature by 18 K, 14 K and 3 K respectively compared with the combination of a heat sink and a heat spreader. It should be noted that the weight of the integrated DLMC is 51 times lighter in weight and 9 times smaller in volume than the heat spreader employed in FIGS. 1 and 2.

TABLE 5

The Combination of heat sinks with Integrated DLMC

|  | Copper heat sink with copper heat spreader (FIG. 1) | Integrated DLMC with a copper heat sink (FIG. 5) | Integrated DLMC with a RSHP heat sink (FIG. 5) | Integrated DLMC with a DSHP heat sink (FIG. 5) |
|---|---|---|---|---|
| Hotspot Temperature (K) | 339.2 | 321 | 320 | 320 |
| Reduction on Hotspot Temperature (K) | Reference | 18.2 | 19.2 | 19.2 |
| Weight Reduction |  | Integrated DLMC is 51 times lighter than the copper heat spreader and 9 times smaller in volume | | |

Finally, we analyzed the effect of two chip-size integrated DLMC on top and at the bottom of the 3D IC structure, as displayed in FIGS. 6 and 7, on the hotspot temperature. The results shown in FIG. 12 clarify the substantial effect of this structure. Two chip-size integrated DLMC lowered the hotspot temperature by another 6.77 K in comparison with employing just one integrated DLMC for 3D IC regardless of having a heat sink on top or not. But having a heat sink on top can definitely improve the thermal performance even further and the set-up can still remain lighter weight compared with the nominal structures (FIGS. 1 and 2).

FIG. 12 The effect of two integrated DLMC on the hotspot temperature of the 3D IC. The effect of multi-layer microchannels on the hotspot temperature of the 3D IC structure (FIGS. 8 and 9) is illustrated in Table 6. As it can be seen the optimal layout is 4 layers. The hotspot temperature is reduced by 21 K and the setup is 102 times lighter in weight compared to the nominal 3D IC structure with a nominal height of 7 mm (FIG. 1). Meanwhile, the total height of the integrated 4-layer microchannel is only 1.9 mm while the nominal 3D IC (FIG. 1) is 7 mm. After 4 layers, the decrease in the hotspot temperature is not significant while the weight and size increase significantly.

TABLE 6

Multilayer Micorchannel Hotspot temperaure

|  | Hotspot Temperature (K) | Total height (mm) | Weight Reduction |
|---|---|---|---|
| Coper heat sink with a heat spreader (FIG. 1) | 339.2 | 7 | Reference |
| 2 layers (FIG. 4) | 324.5 | 1 | 228 times lighter |
| 3 layers (FIG. 8) | 320.28 | 1.45 | 133 times lighter |
| 4 layers (FIG. 9) | 317.85 | 1.9 | 102 times lighter |
| 5 layers (FIG. 9) | 316.91 | 2.35 | 84 times lighter |
| 6 layers (FIG. 9) | 316.27 | 2.8 | 71 times lighter |

Figure 13:
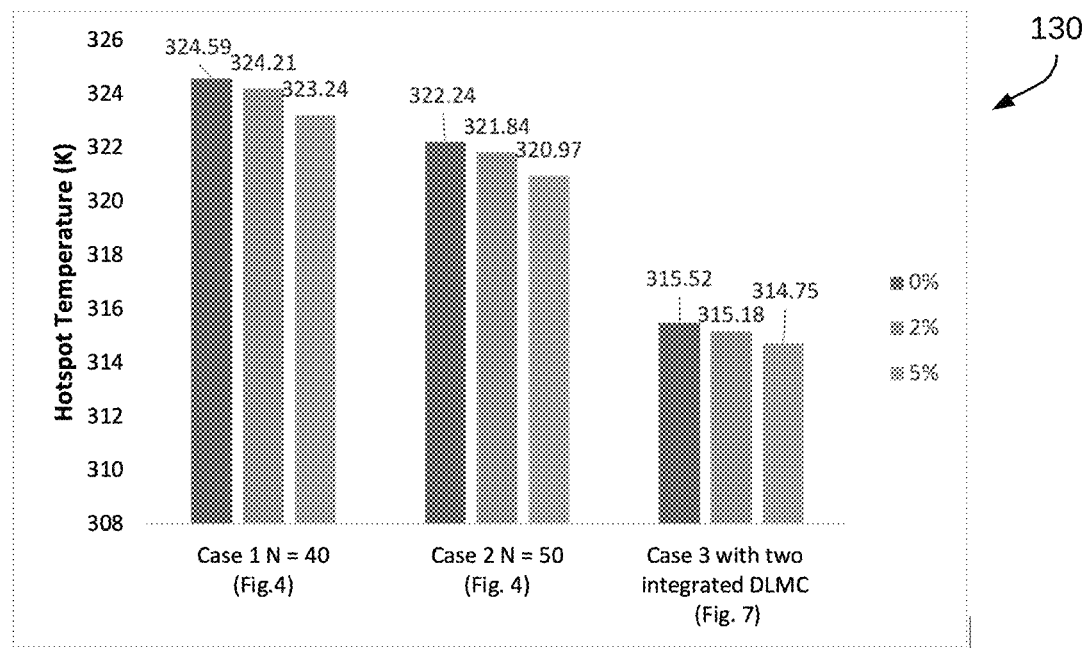
FIG. 13 illustrates a graph with data indicating the influence of nanofluids is insignificant with the hotspot temperature was reduced by 1 K when the volume fraction was increased from 2% to 5% for three cases.

To further optimize the thermal performance of the 3D IC structure, more narrower channels were utilized with the same chip-size integrated DLMC. FIG. 13 shows that when the number of channels increased from N=40 to N=50, the hotspot temperature is lowered by 2 K. The effect is not significant. The effect of nanofluids ($Al_2O_3$) within the integrated DLMC on the hotspot temperature of the 3D ICs was also explored. Three cases were selected to show the impact of the nanofluids. Case 1 is the integrated DLMC with 40 channels and cases 2 is for 50 channels. Case 3 was based on the two integrated DLMC with a copper heat sink above while increasing the volume fraction of the nanofluids. FIG. 13 shows that the influence of nanofluids also is insignificant. The hotspot temperature was reduced by 1 K when the volume fraction was increased from 2% to 5% for all three cases.

A thorough analysis and optimization of the thermal performance of the 3D ICs utilizing the chip-size integrated DLMC and MLMC is presented in this work. The results demonstrate that the integrated DLMC and MLMC not only substantially contribute to improve the thermal performance of the 3D ICs and reduce the hotspot temperature but also greatly reduce the overall packaging size and weight, which is in high demand for the electronic devices in the industry. The main contributions for an integrated DLMC and MLMC are as follows:

(1). The chip-size integrated DLMC without a heat spreader and a heat sink reduce the hotspot temperature by almost 15 K compared with the nominal structure. Meanwhile, the weight of the chip-size integrated DLMC is 1288 times lighter and the size is significantly smaller than the combination of copper heat sinks and heat spreaders.

(2). Two chip-size integrated DLMC on top and bottom of the chip lowered the hotspot temperature by another 6.77 K in comparison of only one integrated DLMC on top of the IC structure. The total temperature reduction in this case was 21 K and the weight was reduced by 99%.

(3). The MLMC has a pronounced effect on reducing the hotspot temperature. The optimal layout was demonstrated to be 4 layers. The hotspot temperature was reduced by 21 K and the structure was 102 times lighter in weight compared to the nominal 3D IC structure.

(4). Integrating a heat sink on top of the DLMC or MLMC without a heat spreader further reduced the hotspot temperature by another 4 K for a total hot spot temperature reduction up to 25 K. Compared to the heat spreader in the nominal structure, a chip-size DLMC is 51 times lighter in weight and 9 times smaller in volume.

(5) The effect of utilizing nanofluids for the 3D IC structure was also investigated and the results were presented. It was shown that the nanofluids did not create a significant reduction within the analyzed proposed innovative 3D IC structure.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

NOMENCLATURE

| | |
|---|---|
| L | Channel length [mm] |
| $W_c$ | Channel width [μm] |
| $H_c$ | Channel height [μm] |
| $W_f$ | Channel fin width [μm] |
| $h_t$ | Channel cover and base thickness [μm] |
| N | Number of channels |
| k | Thermal conductivity [W (m · K)$^{-1}$] |
| n* | Normal coordinate |
| Bi | Biot number |
| p | Pressure [Pa] |
| u | x-component of velocity [m · s$^{-1}$] |
| v | y-component of velocity [m · s$^{-1}$] |
| w | z-component of velocity [m · s$^{-1}$] |
| x, y, z | Cartesian coordinates |
| $Re_h$ | Reynolds number |
| $c_p$ | Specific heat at constant pressure [J (kg · K)$^{-1}$] |
| $Pe_h$ | Peclet number |
| q | Heat flux [W · m$^{-2}$] |
| $q_g$ | Volumetric heat generation rate [W · m$^{-3}$] |
| T | Temperature [K] |
| n | Solid particle shape factor |
| Greek symbols | |
| φ | Volumetric concentration of nanoparticles |
| θ | Dimensionless temperature |
| ρ | Density [kg · m$^{-3}$] |
| μ | Dynamic viscosity [(N · s)m$^{-2}$] |
| Subscripts | |
| f | Fluid |
| s | Solid |
| m | Mean |
| nf | nanofluid |
| bf | Base fluid |
| P | nanoparticle |
| Superscripts | |
| + | Dimensionless quantities |

What is claimed is:

1. A method of fabricating a three-dimensional (3D) integrated circuit (IC) apparatus, comprising:
    forming a 3D IC structure comprising a substrate;
    forming a plurality of integrated double-layer microchannels including a first set of integrated double-layer microchannels and a second set of integrated double-layer microchannels, wherein the 3D IC structure includes the plurality of integrated double-layer microchannels and
    configuring the plurality of integrated double-layer microchannels in a structural arrangement to optimize a thermal performance for the 3D IC structure, wherein the first set of integrated double-layer microchannels is located immediately below a top of the 3D IC structure and the second set of integrated double-layer microchannels is located immediately above the substrate with the substrate located immediately above a bottom of the 3D IC structure.

2. The method of claim 1 wherein the 3D IC structure comprises a metal-oxide semiconductor-integrated circuit.

3. The method of claim 1 further comprising a heat sink located above the first set of integrated double-layer microchannels.

4. The method of claim 3 wherein the heat sink comprises copper.

5. The method of claim 1 further comprising a nanofluid within the plurality of double-layer microchannels.

6. The method of claim 5 wherein the plurality of integrated double-layer microchannels (DLMC) comprises a chip-size integrated DLMC.

7. The method of claim 6 further comprising a heat sink located on top of the chip-size integrated DLMC.

8. The method of claim 1 wherein the plurality of integrated double-layer microchannels comprises integrated 4-layer microchannels.

9. A method of fabricating a three-dimensional (3D) integrated circuit (IC) apparatus, comprising:
    forming a 3D IC structure comprising a substrate and a metal-oxide semiconductor-integrated circuit;

forming a plurality of integrated double-layer microchannels including a first set of integrated double-layer microchannels and a second set of integrated double-layer microchannels, wherein the 3D IC structure includes the plurality of integrated double-layer microchannels and configuring the plurality of integrated double-layer microchannels in a structural arrangement, wherein the first set of integrated double-layer microchannels is located immediately below a top of the 3D IC structure and the second set of integrated double-layer microchannels is located immediately above the substrate with the substrate located immediately above a bottom of the 3D IC structure.

10. The method of claim 9 further comprising locating a heat sink above the first set of integrated double-layer microchannels.

11. The method of claim 10 wherein the heat sink comprises copper.

12. The method of claim 9 further comprising locating a nanofluid within the plurality of double-layer microchannels.

13. The method of claim 12 wherein the plurality of integrated double-layer microchannels (DLMC) comprises a chip-size integrated DLMC.

14. The method of claim 13 further comprising locating a heat sink on top of the chip-size integrated DLMC.

15. The method of claim 9 wherein the plurality of integrated double-layer microchannels comprises integrated 4-layer microchannels.

* * * * *